United States Patent
Davidson et al.

(10) Patent No.: US 11,212,945 B2
(45) Date of Patent: Dec. 28, 2021

(54) SYSTEM AIRFLOW VARIABLE CONFIGURATION

(71) Applicant: HEWLETT PACKARD ENTERPRISE DEVELOPMENT LP, Houston, TX (US)

(72) Inventors: Andrew Davidson, Roseville, CA (US); Bruce Falzarano, Roseville, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 109 days.

(21) Appl. No.: 16/427,740

(22) Filed: May 31, 2019

(65) Prior Publication Data

US 2020/0383245 A1    Dec. 3, 2020

(51) Int. Cl.
H05K 7/20    (2006.01)

(52) U.S. Cl.
CPC ..... H05K 7/20836 (2013.01); H05K 7/20745 (2013.01)

(58) Field of Classification Search
CPC ........... H05K 7/20745; H05K 7/20836; H05K 7/20736; H05K 7/20145; H05K 7/20209; H05K 7/20218; H05K 7/20281; H05K 7/20781; G05B 15/02; G06F 1/20
See application file for complete search history.

(56) References Cited

U.S. PATENT DOCUMENTS

| | | | |
|---|---|---|---|
| 7,212,403 B2 | 5/2007 | Rockenfeller | |
| 7,248,942 B2 | 7/2007 | Bash et al. | |
| 7,259,961 B2 | 8/2007 | Lucero et al. | |
| 7,983,039 B1 | 7/2011 | Nguyen et al. | |
| 8,068,340 B1 | 11/2011 | Nguyen et al. | |
| 8,482,917 B2 | 7/2013 | Rose et al. | |
| 9,936,612 B2 | 4/2018 | Goulden et al. | |
| 2008/0024979 A1* | 1/2008 | Ye | H05K 7/20154 361/691 |
| 2014/0078668 A1* | 3/2014 | Goulden | G06F 1/20 361/679.47 |
| 2015/0130631 A1* | 5/2015 | Patel | F24F 11/62 340/870.07 |
| 2016/0146212 A1* | 5/2016 | Cananzi | F04D 27/00 417/44.11 |

OTHER PUBLICATIONS

Wang, X. et al., Intelligent Sensor Placement for Hot Server Detection in Data Centers, (Research Paper), IEEE Transactions on Parallel and Distributed Systems, Aug. 2013, pp. 1577-1588, vol. 24, No. 8, 11 Pgs.

* cited by examiner

*Primary Examiner* — Kidest Bahta
(74) *Attorney, Agent, or Firm* — Nolte Lackenbach Siegel (57) ABSTRACT

A method for configuring the airflow direction through a chassis having electronic components installed therein. The method may include: powering on at least a first power supply unit installed within the chassis; determining an airflow direction of the first power supply unit may include one or more unidirectional fans; configuring the airflow direction through the chassis to be the airflow direction of the first power supply unit to create a first configured airflow direction; determining an airflow direction of a first fan tray installed within the chassis, the first fan tray may include one or more unidirectional fans; and conducting a conflict check between the first configured airflow direction and the airflow direction of the first fan tray to determine if the airflow directions are substantially the same.

20 Claims, 6 Drawing Sheets

SYSTEM AIRFLOW VARIABLE CONFIGURATION

BACKGROUND

A datacenter, network management center, or other data processing facility may include electronic boxes that requires a thermally controlled environment within the data processing facility. Cooled air may be driven through the electronic boxes for convective cooling of the equipment and its internal electronics. Air heated while flowing through the electronic boxes may be expelled from the electronic boxes and recycled to improve the center's cooling efficiency. Within the electronic boxes, there may be one or more internal fans that pull or push the cooled air through the electronic boxes from one side of an enclosure to another. The fans may be designed to provide sufficient air movement through the electronic box enclosure to appropriately control the temperature of internal electronics within the electronic boxes. The electronic boxes may be designed for either front-to-back airflow or back-to-front airflow.

BRIEF DESCRIPTION OF THE DRAWINGS

The present disclosure may be understood from the following detailed description when read with the accompanying Figures. In accordance with the standard practice in the industry, various features are not drawn to scale. In fact, the dimensions of the various features may be arbitrarily increased or reduced for clarity of discussion.

Some examples of the present application are described with respect to the following figures.

DETAILED DESCRIPTION

Illustrative examples of the subject matter claimed below will now be disclosed. In the interest of clarity, not all features of an actual implementation are described in this specification. It may be appreciated that in the development of any such actual example, numerous implementation-specific decisions may be made to achieve the developers' specific goals, such as compliance with system-related and business-related constraints, which will vary from one implementation to another. Moreover, it may be appreciated that such a development effort, even if complex and time-consuming, would be a routine undertaking for those of ordinary skill in the art having the benefit of this disclosure.

Electronic boxes within a data processing facility may be designed with internal fans to control airflow over and through its internal electronics to control the temperature of the internal electronics. For electronic boxes, both Front-to-Back and Back-to-Front airflow designs may be utilized depending on the particular thermal control needs within the data processing facility. The data processing facility thermal management design parameter considerations may include electronic boxes, such as chassis, that may be installed within one or more racks in the data processing facility. The chassis may include servers, memory storage hardware, switches, firewalls, and other chassis. The chassis may include internal electronic components installed therein for performing various tasks such as switching, storage, server functions, firewall functions, and similar tasks. The chassis may include one or more power supply units, each power supply unit including one or more fans. The chassis may include one or more fan trays. Each fan tray may include one or more fans. The fans may be designed to flow air in only one direction. When operating the chassis, the flow direction of the air through all the fans within a given chassis enclosure may be Front-to-Back or Back-to-Front. There are, however, conditions under which the direction of the flow through a particular fan may be different from the direction of the flow of other fans within the chassis enclosure, causing an airflow conflict and affecting the overall mass flow of air through the chassis enclosure, impacting the thermal environment in the chassis enclosure. For example, during manufacture of a front-to-back designed enclosure, a back-to-front fan tray may be installed in error. Similarly, during maintenance of a back-to-front designed enclosure, a front-to-back fan tray may be installed in error. The conflict might be missed during the startup and testing phases for the chassis and the chassis may be negatively impacted by the potentially out of design condition. If there were a way to identify the assembly errors during production or maintenance, the assembly and maintenance efficiency may be improved, and the overall operational life of the chassis may be improved by avoiding an out of design thermal environment within the chassis enclosures. Additionally, if there were a way to modify a front-to-back enclosure to a back-to-front enclosure and verify the successful modifications or vice versa, logistics savings may be realized. For example, rather than buying replacement chassis, an operator could remove the power supply unit or units and fan tray or trays from the existing chassis and replace them with power supply units and fan trays designed to flow air in a direction opposite that of the original configuration.

Accordingly, examples of the present disclosure may provide a method for configuring the airflow direction through a chassis having at least one power supply unit installed therein. The power supply unit may include one or more unidirectional fans. The chassis may include one or more fan trays installed therein. Each fan tray may include one or more unidirectional fans. The method may include powering on at least a first power supply unit installed within the chassis; during initialization, determining the airflow direction of the first power supply unit; and configuring the airflow direction through the chassis to be the airflow direction of the first power supply unit to create a configured airflow direction. The method may further include determining the airflow direction of a first fan tray having one or more unidirectional fans; conducting a conflict check between the configured airflow direction and the airflow direction of the first fan tray to determine if the airflow directions are substantially the same; logging the results; and disabling the first fan tray and/or notifying an operator or user if the airflow directions are substantially opposite to one another. In examples, the method may include determining the airflow direction of each of the fan trays installed within the chassis; conducting a conflict check between the configured airflow direction and the airflow direction of all the fan trays to determine if the airflow directions are substantially the same; logging the results; and disabling those fan trays with airflow directions substantially opposite to the configured airflow direction. For clarity, substantially opposite means that when a first omnidirectional fan is causing airflow to be directed in one direction, a second omnidirectional fan is causing airflow to be directed substantially in the opposite direction.

In addition, examples may provide a system for configuring the airflow direction through one or more chassis having at least one power supply unit installed therein. The system may include at least one fan tray installed therein. The system may include a memory that stores instructions that cause a processor to determine the airflow direction of a first power supply unit may include one or more unidirectional fans; and configure the airflow direction through a first chassis to be the airflow direction of the first power supply unit to create a configured airflow direction. The system may determine the airflow direction of a first fan tray including one or more unidirectional fans; conduct a conflict check between the configured airflow direction and the airflow direction of the first fan tray to determine if the airflow directions are substantially the same; log the results; and disable the first fan tray and/or notify an operator if the airflow directions are substantially opposite to one another.

Figure 1:
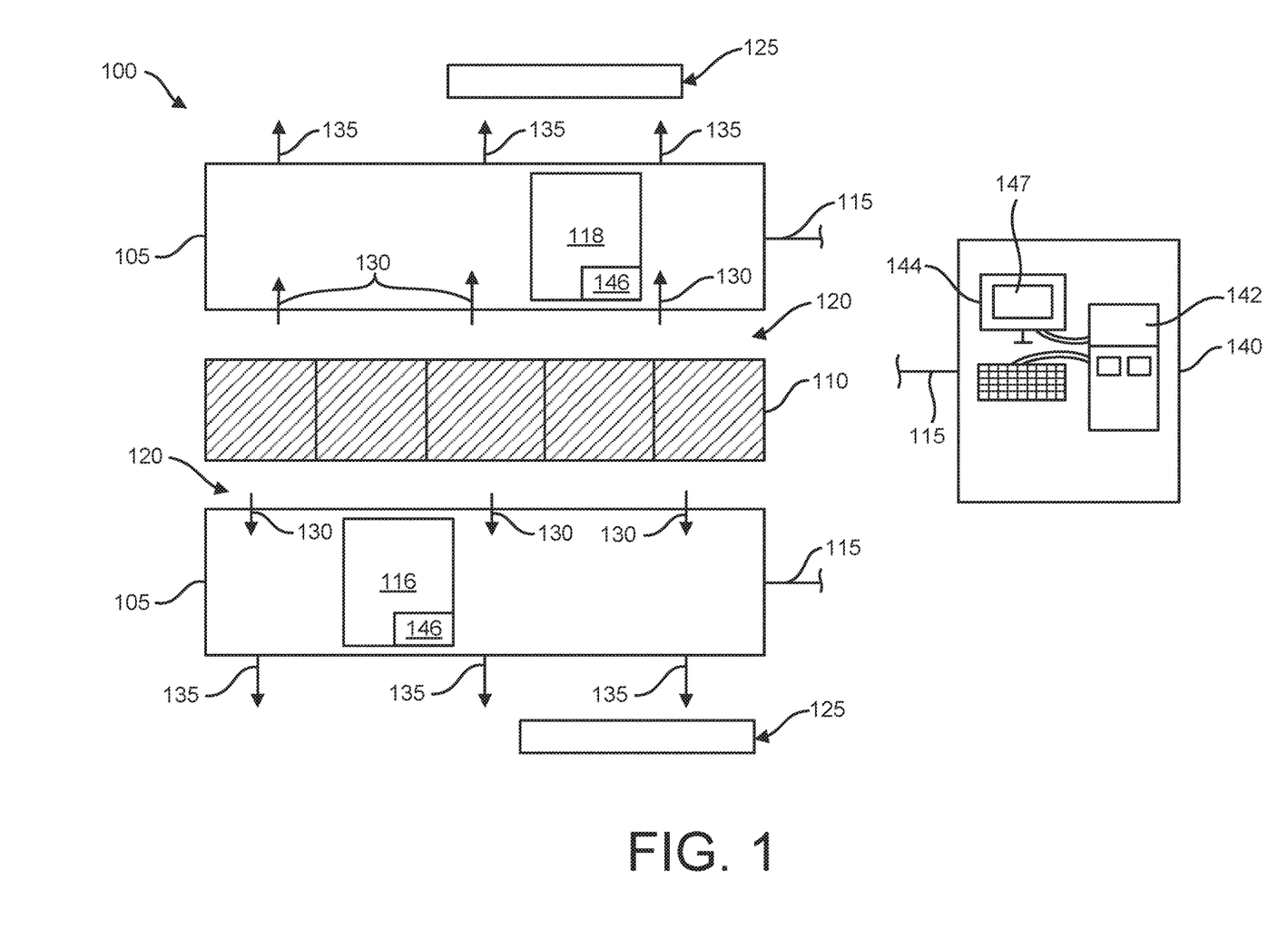
FIG. 1 is a top view of a data processing facility with racks and chassis installed therein, according to one or more examples disclosed.

Turning now to the drawings, FIG. 1 is a top view of a data processing facility 100 with racks 105 and chassis 116, 118 installed therein, according to one or more examples disclosed. The chassis 116, 118 within the rack 105 can be any number or combination, two units 116, 118 are shown. The data processing facility 100 may include one or more racks 105, two are shown. The data processing facility 100 may include a passageway 110 between the racks 105. Conditioned air 130 may be introduced between the racks 105 through vents 120 which may be any opening through which air may be expelled. The conditioned air 130 may be distributed through the racks 105 and through and around the chassis 116, 118. Heat from the chassis 116, 118 may be convectively transferred to the conditioned air 130, increasing the temperature of the conditioned air 130, and may be expelled from the racks 105 as exhaust 135. The exhaust 135 may be introduced into returns 125, which may be any opening through which air may be introduced, reconditioned, and reintroduced back into the data processing facility 100 as conditioned air 130. Although the chassis 116, 118 are depicted within the racks 105, the chassis 116 or 118 may be located on a test stand, an assembly line, a technician's station, a desk, or anywhere the environmental conditions are appropriate for the given operational design of the chassis 116 or 118.

The chassis 116, 118 may include electronic components installed therein. The chassis 116, 118 and the electronic components installed therein may be physical hardware, a simulation thereof, or combinations thereof. The chassis 116, 118 may be any network switch, switching hub, bridging hub, or MAC bridge that may connect devices on a computer network by using packet switching to receive, process, and forward data to a destination device. The chassis 116, 118 may be a multipart network bridge that uses hardware addresses to process and forward data at the data link layer (layer 2) of the open systems interconnection (OSI) model. The chassis 116, 118 may be a multilayer switch that may process data at the network layer (layer 3) by incorporating routing functionality. The chassis 116, 118 may be one or more servers, memory storage hardware, switches, and/or firewalls. The chassis 116, 118 may be thermally controlled using a front-to-back design or a back-to-front design.

The chassis 116, 118 may include a computing capability and a memory capability for storing software programs and data. The chassis 116, 118 may provide a platform for operating a test and control tool 146. The test and control tool 146 may initialize and control the chassis 116, 118. In examples, the test and control tool 146 may be software resident in or operating from within the chassis 116, 118 and may be accessible by a human interface 140. The test and control tool 146 may be accessed by and used by an operator to test and/or control the chassis 116, 118.

The human interface 140 may be utilized by the operator and may be located within the data processing facility 100 or elsewhere. The human interface 140 may include an input device 142 and a display device 144. The input device 142 may include a computing capability and a memory capability for storing software programs and data. The display device 144 may display information from the test and control tool 146 via a graphical user interface (GUI) 147. The human interface 140 and/or the test and control tool 146 may be used to send test and control instructions over a communications link 115 to the chassis 116, 118.

The communications link 115 may be a hardline, Wi-Fi connection, fabric, any number thereof, and/or combinations thereof over which the test and control instructions over a communications link 115 to the chassis 116, 118. The term, fabric, refers to, at least in part, to a communication network that may be used between the human interface 140 and the chassis 116, 118. The communications link 115 may use communication and transport protocols for data that may include Ethernet, Fibre Channel, Infinibandsm, Gen-Z, and the like.

The Ethernet communication and transport protocol for data may operate within a physical layer and a data link layer on an open systems interconnection network protocol model. The Ethernet communication and transport protocol may include two units of transmission, a packet and a frame. The frame may include the payload of data being transmitted as well as the physical media access control (MAC) addresses of both the sender and receiver, virtual local area network (ULAN) tagging, quality of service information, and error correction information. Each packet may include a frame and additional information to establish a connection and mark where the frame starts. The Fibre Channel communication and transport protocol may include data link layer switching technologies where hardware may handle the entire protocol in a Fibre Channel fabric. The Infiniband communication and transport protocol may include a switch-based serial point-to-point interconnect architecture where data may be transmitted in packets that form a message. The Infiniband communication and transport protocol may include remote direct memory access support, simultaneous peer-to-peer communication, and end-to-end flow control. The Gen-Z communication and transport protocol may be an open-systems interconnect that may provide memory semantic access to data and devices via direct-attached, switched, or fabric topologies. The Gen-Z communication and transport protocol may enable any type and mix of dynamic random-access memory (DRAM) and non-volatile memory to be directly accessed by applications or through block-semantic communications.

Figure 2:
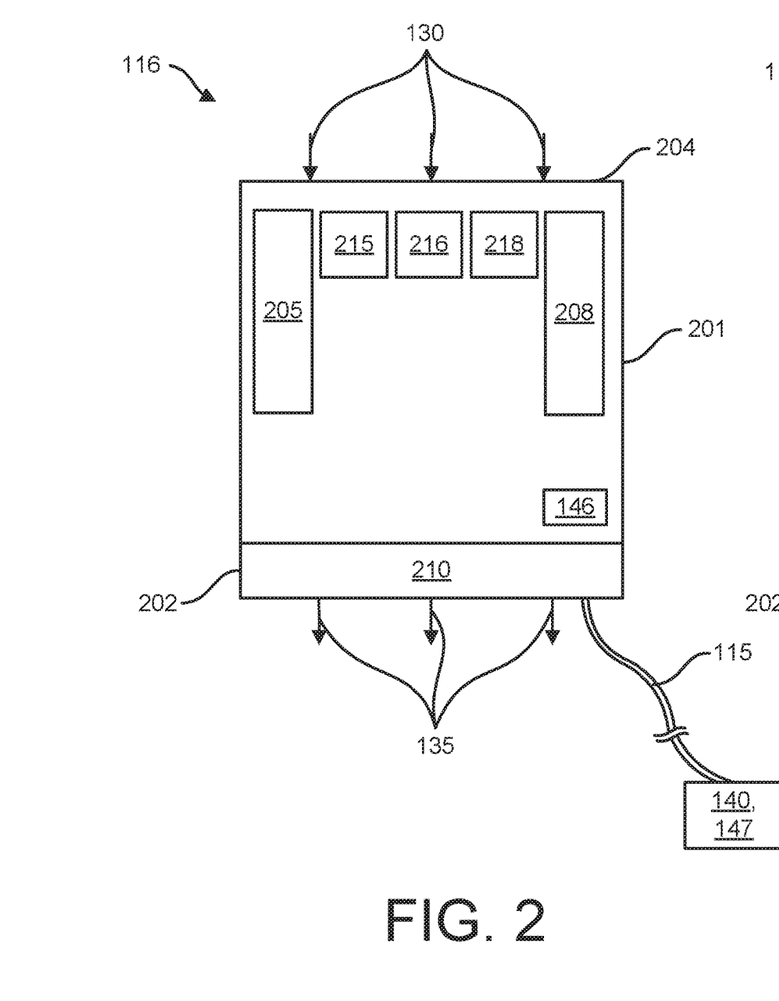
FIG. 2 is a chassis including a chassis enclosure, according to one or more examples disclosed.

FIG. 2 is a chassis 116 including a chassis enclosure 201, according to one or more examples disclosed. The chassis enclosure 201 may have a front portion 202 and a back portion 204, and may include side walls, a top, and a bottom, not separately depicted. The chassis enclosure 201 may include openings, not shown, for air flow from the back portion 204 to the front portion 202, as depicted, or vice versa. The chassis enclosure 201 may include front panel network ports 210. The front panel network ports 210 may include a connection to communications link 115 through which the test and control tool 146 may be utilized to operate the chassis 116. The connection to communications link 115 may be provided through other ports, not shown.

Installed within the chassis enclosure 201 may be electronic components. The electronic components may include a first or primary power supply unit 205 and may include a secondary power supply unit 208. The power supply units, 205 and 208, may each include one or more unidirectional fans for forcing conditioned air 130 over and through the power supply units 205, 208 and the chassis enclosure 201. For clarity, unidirectional fans may push air or fluid substantially in one flow direction. The power supply units, 205 and 208, may provide power to the electronic components within the chassis enclosure 201. The power supply units, 205 and 208, may be removable and replaceable such as line or field replaceable units. There may be additional power supply units, not shown, installed within the chassis enclosure 201.

The electronic components may include one or more fan trays, three are shown, fan trays 215, 216, and 218. The fan trays 215, 216, and 218 may each include one or more unidirectional fans for forcing conditioned air 130 over and through the chassis enclosure 201 and the fan trays 215, 216, and 218. The fan trays 215, 216, and 218 may be field replaceable units.

Figure 3:
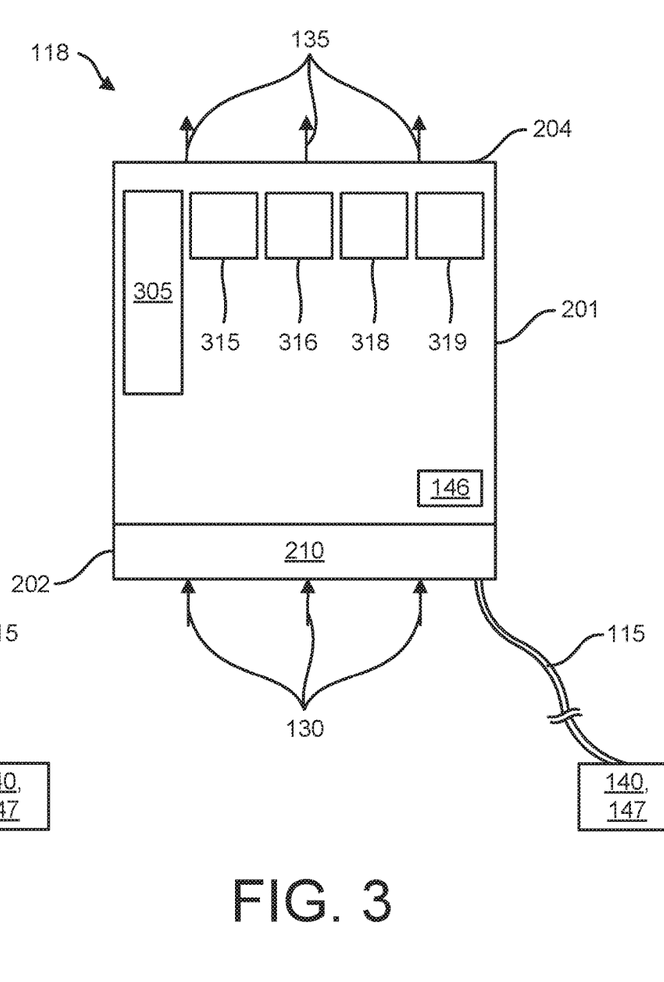
FIG. 3 is a chassis including a chassis enclosure, according to one or more examples disclosed.

FIG. 3 is a chassis 118 including a chassis enclosure 201, according to one or more examples disclosed. The chassis enclosure 201 may include openings, not shown, for air flow from the front portion 202 to the back portion 204, as depicted, or vice versa. The front panel network ports 210 may include a connection to communications link 115 through which the test and control tool 146 may be utilized to operate the chassis 118. The connection to communications link 115 may be provided through other ports, not shown.

Installed within the chassis enclosure 201 may be electronic components. The electronic components may include a primary power supply unit 305. The power supply unit 305 may include one or more unidirectional fans, not shown, for forcing conditioned air 130 over and through the power supply unit 305 and the chassis enclosure 201. The power supply unit 305 may provide power to the electronic components within the chassis enclosure 201. The power supply unit, 305, may be a field replaceable unit. There may be additional power supply units, not shown, installed within the chassis enclosure 201.

The electronic components may include one or more fan trays, four are shown, fan trays 315, 316, 318, and 319. The fan trays 315, 316, 318, and 319 may each include one or more unidirectional fans for forcing conditioned air 130 over and through the chassis enclosure 201 and the fan trays 315, 316, 318, and 319. The fan trays 315, 316, 318, and 319 may be field replaceable units.

In examples, with reference to FIG. 2 and FIG. 3, upon initialization, the test and control tool 146 may autonomously configure the chassis 116, 118 as either front-to-back or back-to-front airflow chassis. The test and control tool 146 may determine the airflow direction of the unidirectional fans that may be in each of the primary power supply units 205 and 305 to configure the chassis 116, 118. In some examples, the test and control tool 146 may determine that the airflow direction of the unidirectional fan or fans in the primary power supply unit 205 of FIG. 2 is from the back portion 204 to the front portion 202 of the chassis enclosure 201. Based on this determination, the test and control tool 146 may determine the configured airflow direction for the chassis 116 as having a back-to-front airflow as depicted in FIG. 2. In some examples, the test and control tool 146 may determine that the airflow direction of the unidirectional fan or fans in the primary power supply unit 305 of FIG. 3 is from the front portion 202 to the back portion 204 of the chassis enclosure 201. Based on this determination, the test and control tool 146 may determine the configured airflow direction for the chassis 118 as having a front-to-back airflow as depicted in FIG. 3.

The configured airflow direction may be utilized to determine airflow direction conflicts. In examples, the test and control tool 146 may determine the airflow direction of the unidirectional fan or fans that may be in the secondary power supply unit 208 or the fan trays 215, 216, 218, 315, 316, 318, and 319. If the airflow direction of the unidirectional fan or fans in the secondary power supply unit 208 or one or more of the fan trays 215, 216, 218, 315, 316, 318, or 319 conflict with the configured airflow direction for the chassis 116, 118, the test and control tool 146 may disable operations of the secondary power supply unit 208 and/or those fan trays with conflicting airflow directions. The test and control tool 146 may provide the operator with data about the conflicts by identifying the secondary power supply unit 208 and/or those fan trays 215, 216, 218, 315, 316, 318, or 319 with airflow conflicts.

The test and control tool 146 and data associated therewith, may be accessed through the operator interface 140. Utilizing the access to the test and control tool 146, the operator may test the electronic components within the chassis 116, 118. The test and control tool 146 may allow an operator to power on the chassis 116, 118 and perform certain tests and configure the chassis 116, 118. In one or more examples, the test and control tool 146 may allow the operator, during a given runtime or after a service interrupt event, to determine the configured airflow direction of the chassis 116, 118 as either front-to-back or back-to-front airflow. The test and control tool 146 may provide the operator with data about the airflow direction of the unidirectional fan or fans that may be in each of the power supply units 205, 208, or 305 or the fan trays 215, 216, 218, 315, 316, 318, or 319. The test and control tool 146 may provide the operator with data about any airflow conflicts. If the airflow direction of the unidirectional fan or fans that may be in the power supply units 205, 208, or 305 or each of the fan trays 215, 216, 218, 315, 316, 318, and 319 do not match the configured airflow direction, the test and control tool 146 may provide the operator with data about which power supply units 205, 208, or 305 or fan trays 215, 216, 218, 315, 316, 318, or 319 have airflow conflicts. The operator may decide to continue to utilize the chassis 116 and 118 during the given runtime event or may choose to discontinue operations with the chassis 116 or 118 where a conflict has been determined. The operator may decide to modify the particular electronic box or boxes to eliminate the conflict by replacing the conflicting power supply units 205, 208, or 305 or fan tray 215, 216, 218, 315, 316, 318, or 319.

In some examples, upon initialization, the primary power supply unit 205 may be missing from the chassis 116. In this example, the airflow direction of the secondary power supply unit 208 may be used to configure the configured airflow direction for the chassis 116 to either front-to-back or back-to-front during a given runtime event. For clarity, a given runtime event is the period of time for a particular electronic box between the time the chassis 116 or 118 is powered on to when the chassis 116 is powered off, a first runtime event for the chassis 116, or the chassis 118 is powered off, a first runtime event for the chassis 118. In some examples, a given runtime event may be the period of time between when the chassis 116 or 118 is powered on and an operator sends a command to the chassis 116 or 118 to reset the given runtime event to a new runtime event.

Figure 4:
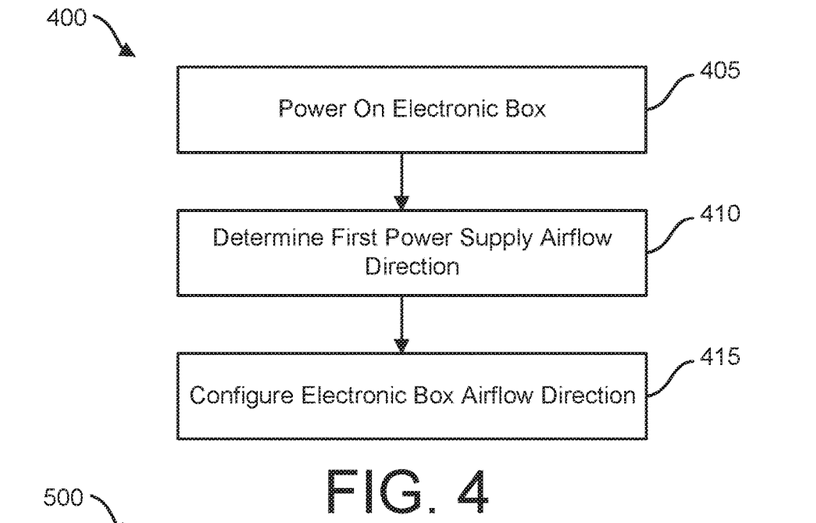
FIG. 4 is a flow chart depicting a method for configuring the chassis, according to one or more examples disclosed.

FIG. 4 is a flow chart depicting a method 400 for configuring the chassis 116, 118, according to one or more examples disclosed. The method 400 may include powering on (block 405) a particular electronic box and at least one of the electronic components installed therein; determining (block 410) a first power supply airflow direction; and configuring (block 415) the electronic box airflow direction based on the airflow direction of the first power supply to create the configured airflow direction.

In examples, with reference to FIG. 1, FIG. 2, and FIG. 3, the chassis 116 and/or the chassis 118 may be located anywhere and may be powered on (block 405). The chassis 116, the chassis 118, and/or any number of other chassis, not shown, that may be installed within the data processing facility 100. The test and control tool 146 may determine (block 410) the airflow direction of the primary power supply units 205 and 305. The test and control tool 146 may determine (block 410) the airflow direction of the primary power supply units 205 and 305 by sending a request to the primary power supply units 205 and 305 to return data about the primary power supply units 205 and 305 or about the flow direction of the unidirectional fan or fans, not shown, installed within the primary power supply units 205 and 305. For example, an identification number may be stored within an EEPROM or other memory within the primary power supply units 205 and 305. By receiving the identification number from the primary power supply units 205 and 305, the test and control tool 146 may use a look-up-table or other data to determine the flow direction of the unidirectional fan or fans. In other examples, the data may indicate that the unidirectional fan or fans are configured for front-to-back or back-to-front operations. The test and control tool 146 may configure (block 415) the airflow direction of the chassis 116 or 118 based on the airflow direction of the primary power supply units 205 or 305 to create the configured airflow direction.

Figure 5:
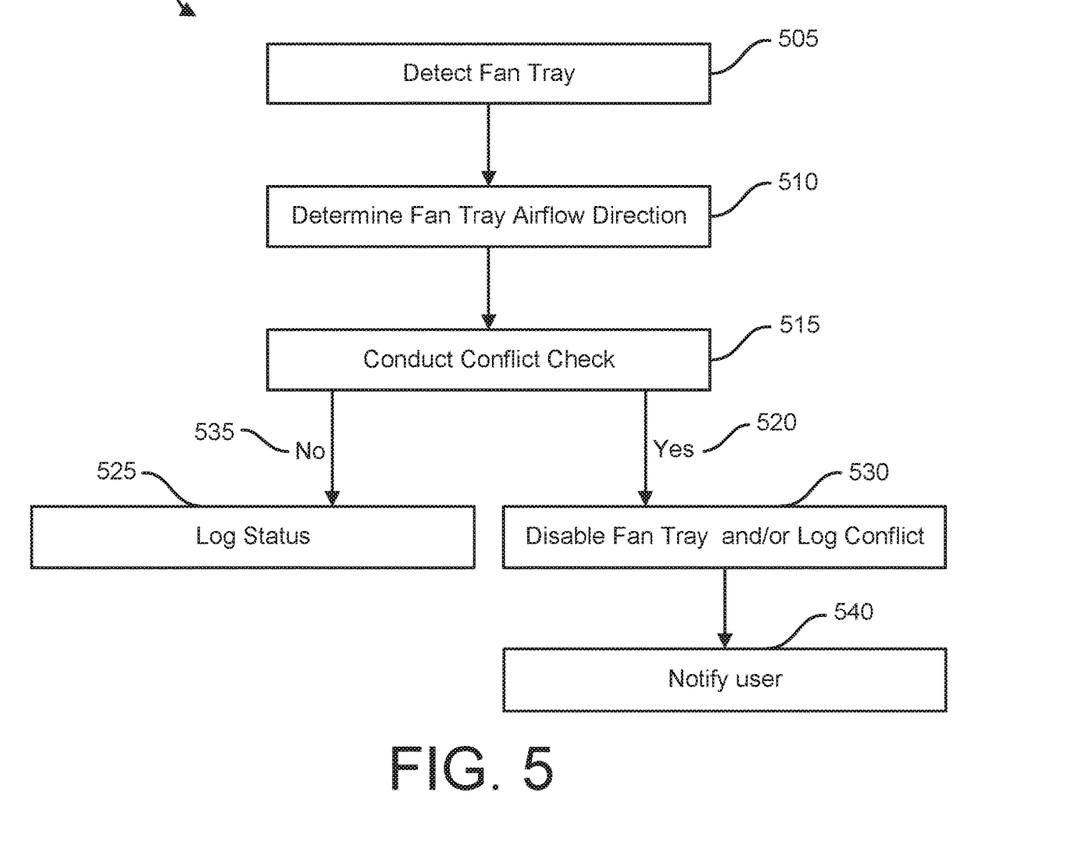
FIG. 5 is a flow chart depicting a method for performing a conflict check for fan trays installed within the chassis, according to one or more examples disclosed.

FIG. 5 is a flow chart depicting a method 500 for performing a conflict check for fan trays installed within the chassis 116, 118, according to one or more examples disclosed. The method 500 may include detecting (block 505) fan trays; determining (block 510) the airflow direction of the fan trays; conducting (block 515) conflict checks, and logging the status (block 525) of the airflow direction if no conflict is determined (block 515) or logging (block 530) the conflict if a conflict is determined (block 515) and notifying (block 540) the operator or operators.

In examples, with reference to FIG. 1, FIG. 2, and FIG. 3, the test and control tool 146 may detect (block 505) if the fan trays 215, 216, 218, 315, 316, 318, or 319 are present within the chassis 116, 118 by sending a request to return information about the fan trays 215, 216, 218, 315, 316, 318, and 319 installed therein. The test and control tool 146 may determine (block 510) the airflow direction of the fan trays 215, 216, 218, 315, 316, 318, and 319. The test and control tool 146 may determine (block 510) the airflow direction of the fan trays 215, 216, 218, 315, 316, 318, and 319 by sending a request to the fan trays 215, 216, 218, 315, 316, 318, and 319 to return data about the fan trays 215, 216, 218, 315, 316, 318, and 319 or about the flow direction of the unidirectional fan or fans, not shown, installed within the fan trays 215, 216, 218, 315, 316, 318, and 319. For example, an identification number may be stored within an EEPROM or other memory within the fan trays 215, 216, 218, 315, 316, 318, and 319. By receiving the identification number from the fan trays 215, 216, 218, 315, 316, 318, and 319, the test and control tool 146 may use a look-up-table or other data to determine the flow direction of the associated unidirectional fan or fans. In examples, the data may indicate that the unidirectional fan or fans are configured for front-to-back or back-to-front operations. In examples, the data returned from the fan trays 215, 216, 218, 315, 316, 318, and 319 may indicate that a voltage sensor, not shown, within the fan trays 215, 216, 218, 315, 316, 318, or 319 returns a voltage that is either above a certain voltage or below a certain voltage. If the voltage sensor indicates that the measured voltage is above the certain voltage, the airflow direction through the fan trays 215, 216, 218, 315, 316, 318, or 319 may be in one direction. If the voltage sensor indicates that the measured voltage is below a certain voltage, the airflow direction through the fan trays 215, 216, 218, 315, 316, 318, or 319 may be in the opposite direction.

In other examples, the data returned from the fan trays 215, 216, 218, 315, 316, 318, and 319 may be from an opto-isolator, not shown. A blockage, such as a dielectric barrier, may be placed (or not placed) between a light source of the opto-isolator and a light sensor, such as a phototransistor, of the opto-isolator to indicate the fan direction of a given fan trays. For example, the opto-isolator from a first fan tray, which may be any of the fan trays 215, 216, 218, 315, 316, 318, and 319, may return a high or low reading based on the presence of the blockage. The high reading from an opto-isolator may indicate that the fan direction for the particular first fan tray may be either front-to-back or back-to-front. The low reading from the opto-isolator may indicate that the airflow direction for the particular first fan tray may be the opposite of the airflow direction indicated by a high opto-isolator reading. The airflow direction for each of the fan trays 215, 216, 218, 315, 316, 318, and 319 may be determined based on the voltage reading from the opto-isolator. For clarity, an opto-isolator may be or include an electronic component that can transfer, using light, electrical signals between two isolated circuits.

A conflict check may be conducted (block 515) between the configured airflow direction and the airflow direction of the corresponding fan trays 215, 216, 218, 315, 316, 318, and 319. In examples, conducting (block 515) a conflict check may include comparing the configured airflow direction, which may be either front-to-back or back-to-front, to the airflow direction of the corresponding fan trays 215, 216, 218, 315, 316, 318, and 319. If there is no conflict, a difference between the configured airflow direction and the determined airflow directions, the test and control tool 146 may log (block 625) that no conflict exists. If there is a conflict or conflicts, the test and control tool 146 may disable operations of the fan trays 215, 216, 218, 315, 316, 318, or 319 having the airflow direction conflict and log (block 530)

the existence of the conflict. The test and control tool 146 may notify (block 540) the operator of the conflict or conflicts.

In examples, the test and control tool 146 may notify (block 540) the operator of the conflict by changing the display color of or otherwise highlighting a message within the graphical user interface 147, posting the message within a pop-up window within the graphical user interface 147, sending an e-mail, sending an SMS message, sending a voice message, or by any other communications means. The test and control tool 146 may notify (block 540) the operator of the conflict multiple times over similar or various periods of time as long as the conflict exists. After the first or subsequent notifications (block 540), the operator may send a command, not depicted, to the test and control tool 146 to stop notifying the operator of the conflict. After receiving the notification (block 540), the operator may remove the conflicting fan tray or trays, such as one or more of the fan trays 215, 216, 218, 315, 316, 318, or 319, from the electronic box where the conflict exists, such as chassis 116 and/or 118, and replace the removed fan trays 215, 216, 218, 315, 316, 318, and/or 319 with replacement fan trays having an airflow direction that is the same as the configured airflow direction.

Figure 6:
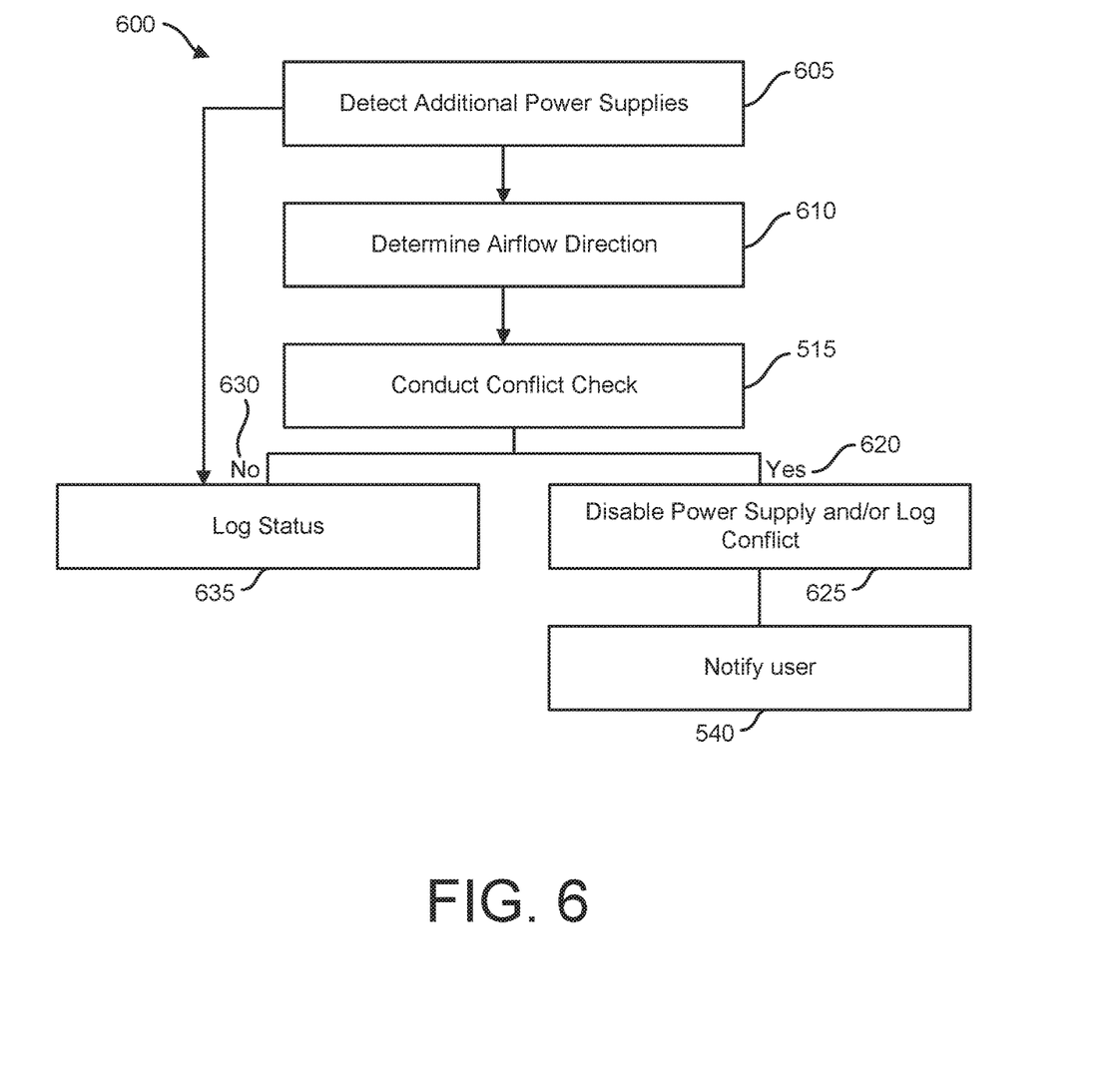
FIG. 6 is a flow chart depicting a method for performing a conflict check for replacement or additional power supply units installed within the chassis, according to one or more examples disclosed.

FIG. 6 is a flow chart depicting a method 600 for performing a conflict check for replacement or additional power supply units installed within the chassis 116, 118, according to one or more examples disclosed. The method 600 may include detecting (block 605) additional power supply units; determining (block 610) the airflow direction of the additional power supply units; conducting (block 515) conflict checks, and logging the status (block 635) of the airflow direction if no conflict is determined (block 515) or disabling and logging (block 625) the detected additional power supply units if a conflict is determined (block 515) and notifying (block 540) the operator or operators.

In examples, with reference to FIG. 1, FIG. 2, and FIG. 3, the test and control tool 146 may detect (block 605) if an additional power supply unit, such as the secondary power supply unit 208, is present within the chassis 116, 118 by sending a request to return information about additional power supply units that may be installed therein. If there are no additional power supply units indicated, as depicted within chassis 118, the test and control tool 146 may stop and log (block 635) the status to indicate there are no other power supply units detected within the chassis 116 or 118.

If a replacement or additional or second power supply unit is detected (block 605), the test and control tool 146 may determine (Block 610) the airflow direction of the additional power supply unit, such as the secondary power supply unit 208. In examples, the test and control tool 146 may determine (block 610) the airflow direction of the secondary power supply unit 208 by sending a request to the secondary power supply unit 208 to return data about the secondary power supply unit 208 or about the flow direction of the unidirectional fan or fans, not shown, installed within the secondary power supply unit 208. For example, an identification number may be stored within an EEPROM or other memory within the secondary power supply unit 208. By receiving the identification number from the secondary power supply unit 208, the test and control tool 146 may use a look-up-table or other data to determine the flow direction of the unidirectional fan or fans. In other examples, the data may indicate that the unidirectional fan or fans are configured for front-to-back or back-to-front operations.

A conflict check may be conducted (block 515) between the configured airflow direction and the airflow direction of the replacement or additional power supply unit, such as secondary power supply unit 208. In examples, conducting (block 515) a conflict check may include comparing the configured airflow direction, which may be either front-to-back or back-to-front, to the airflow direction of the secondary power supply unit 208. If there is no conflict, no difference between the configured airflow direction and the determined airflow directions, the test and control tool 146 may log (block 635) that no conflict exists. If there is a conflict, where the airflow directions are substantially opposite to one another, the test and control tool 146 may disable (block 625) the secondary power supply unit 208 and/or log the existence of the conflict. The test and control tool 146 may notify (block 540) the operator of the conflict.

In examples, after receiving the notification (block 540), the operator may remove the conflicting power supply unit, such as secondary power supply unit 208, from the electronic box where the conflict exists, and replace the secondary power supply unit 208 with a power supply unit having an airflow direction that is the same as the airflow direction of the primary power supply unit 205, 305.

In some examples, once the airflow direction is configured (FIG. 4, block 415), the configured airflow direction may remain the same as long as the chassis 116, 118 remains powered. If the power supply units 205, 208, or 305 or fan trays 215, 216, 218, 315, 316, 318, or 319 were removed from the chassis 116, 118 and replaced while the chassis 116, 118 remained powered on, the test and control tool 146 may determine (Block 510) the airflow direction of the replacement power supply units or fan trays, not shown. The test and control tool 146 may determine (block 610) the airflow direction of the replacement power supply units or determine (block 510) the airflow direction of the replacement fan trays by sending a request to return data about the replacement power supply unit or fan trays or about the flow direction of the unidirectional fan or fans, not shown, installed therein.

A conflict check may be conducted (block 515) between the configured airflow direction and the airflow direction of the replacement power supply units or fan trays. In examples, conducting (block 515) a conflict check may include comparing the configured airflow direction, which may be either front-to-back or back-to-front, to the airflow direction of the replacement power supply units or fan trays. If there is a conflict, where the airflow directions are substantially opposite to one another, the test and control tool 146 may disable (block 525, 625) operations of the conflicting replacement power supply units or fan trays and/or log the existence of the conflict. The test and control tool 146 may notify (block 540) the operator of the conflict. In examples, where the replacement power supply unit was the only power supply unit within the chassis, such as chassis 118, this may cause an immediate shut down of the chassis 118.

Figure 7:
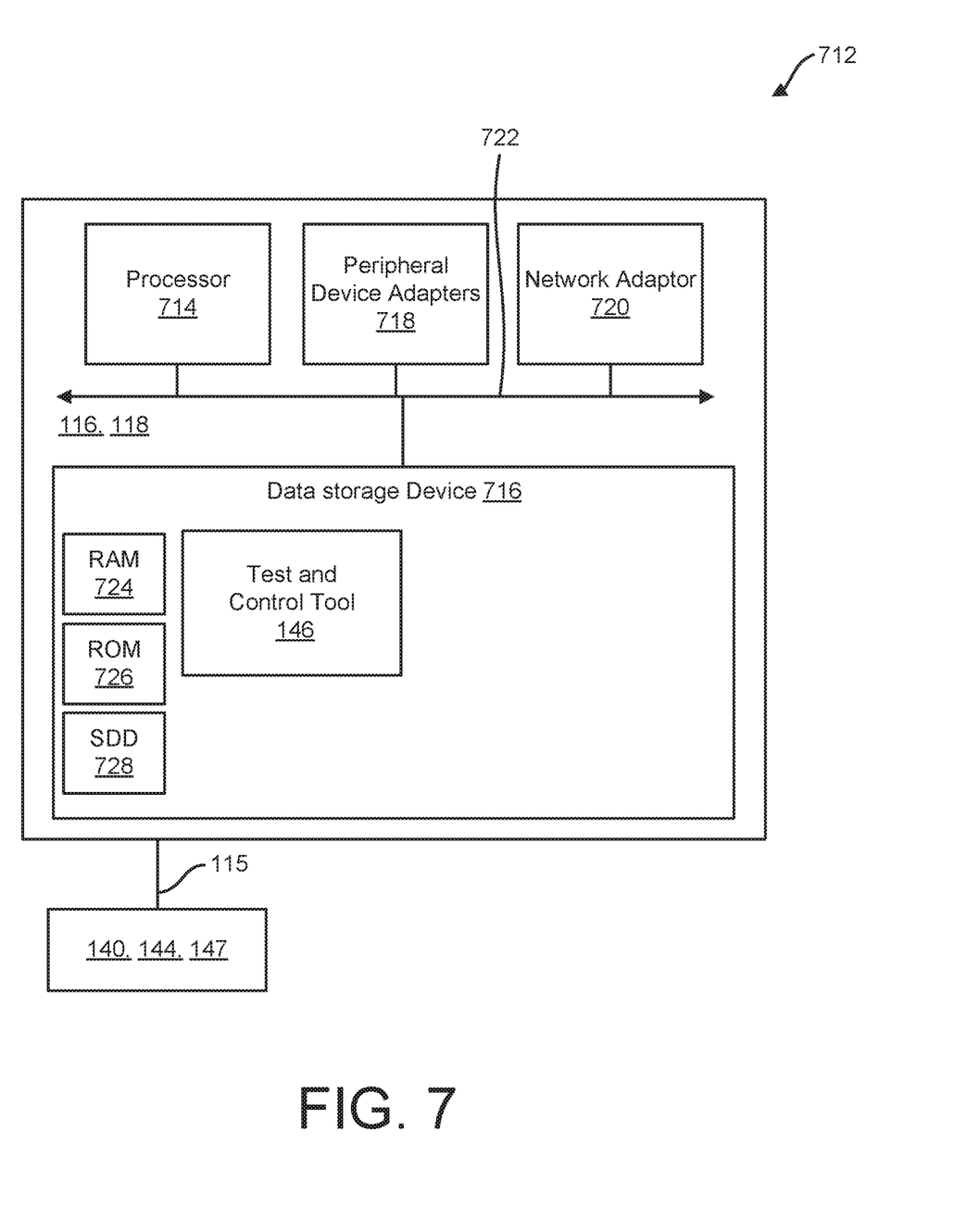
FIG. 7 is a computing system for configuring the airflow direction through the chassis, according to one or more examples disclosed.

FIG. 7 is a computing system 712 for configuring the airflow direction through the chassis 116, 118, according to one or more examples disclosed. The chassis 116, 118, with reference to FIG. 1 and FIG. 2, may include the computing system 712. The computing system 712 may be implemented in an electronic device. Examples of electronic devices include servers, desktop computers, laptop computers, cloud-based computers, personal digital assistants (PDAs), mobile devices, smartphones, gaming systems, and tablets, among other electronic devices. The test and control tool 146 may be software that may run on the computing system 712.

The computing system 712 may be utilized in any data processing scenario including, stand-alone hardware, mobile applications, through a computing network, or combinations thereof. Further, the computing system 712 may be used in a computing network, a public cloud network, a private cloud network, a hybrid cloud network, the communications link 115, other forms of networks, or combinations thereof. In one example, the methods provided by the computing system 712 are provided as a software as a service over the communications link 115 by, for example, a third party.

To achieve its desired functionality, the computing system 712 may include various hardware components. Among these hardware components may be a number of processors 714, a number of data storage devices 716, a number of peripheral device adapters 718, and a number of network adapters 720. These hardware components may be interconnected through the use of a number of busses and/or network connections. In examples, the processor 714, data storage device or tangible, non-transitory computer readable medium 716, peripheral device adapters 718, and a network adapter 720 may be communicatively coupled via a bus 722.

The processor 714 may include the hardware architecture to retrieve executable code from the data storage device 716 and execute the executable code. The executable code may, when executed by the processor 714, cause the processor 714 to implement at least the functionality of powering on at least some of the electronic components within at least one chassis 116, 118, as well as other functionality. For example, the executable code may, when executed by the processor 714, cause the processor 714 to communicate with at least one chassis 116, 118 and then determine the airflow direction of the chassis 116 or 118 to configure the airflow direction for the chassis 116 and/or 118 during a given runtime event. The functionality of the computing system 712 is in accordance with the methods of the present specification described herein. In the course of executing code, the processor 714 may receive input from and provide output to a number of the chassis, such as chassis 116 and 118, under test and or operational control by the operator.

The computing system 712 may include the chassis 116 and/or 118 and/or other chassis, not shown. The human interface 140 may be used to send configuration commands, settings, and operating instructions over the communications link 115 to the chassis 116 and/or 118. The test and control tool 146 may be used by the operator to manipulate displayed configuration commands, settings, and operating instructions associated with configuring the chassis 116 and/or 118.

The data storage device 716 may store data such as executable program code that is executed by the processor 714 or other processing device. The processor 714 may be a central processing unit that may execute a pre-boot basic input/output system (BIOS) and/or an operating system in the computing system 712. As will be discussed, the data storage device 716 may specifically store computer code representing a number of applications that the processor 714 may execute to implement at least the functionality described herein. The processor 714 may execute the number of applications independently from, through, or concurrently with the pre-boot BIOS and/or the operating system.

The data storage device 716 may include various types of memory modules, including volatile and nonvolatile memory. For example, the data storage device 716 of the present example includes Random Access Memory (RAM) 724, Read Only Memory (ROM) 726, and Hard Disk or Solid State Drive (SDD) memory 728. Many other types of memory may also be utilized, and the present specification contemplates the use of many varying type(s) of memory in the data storage device 716 as may suit a particular application of the principles described herein. In certain examples, different types of memory in the data storage device 716 may be used for different data storage functions. For example, in certain examples the processor 714 may boot from Read Only Memory ROM 726, maintain non-volatile storage in the SSD memory 728, and execute program code stored in RAM 724.

The data storage device 716 may include a computer readable medium, a computer readable storage medium, or a non-transitory computer readable medium, among others. For example, the data storage device 716 may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a solid state drive, a random access memory (RAM), a read-only memory (ROM), an erasable programmable read-only memory (EEPROM or Flash memory), a portable compact disc read-only memory (CD-ROM), an optical storage device, a magnetic storage device, or any suitable combination of the foregoing. In the context of this document, a computer readable storage medium may be any tangible medium that may contain, or store computer usable program code for use by or in connection with an instruction execution system, apparatus, or device. In another example, a computer readable storage medium may be any non-transitory medium that may contain or store a program for use by or in connection with an instruction execution system, apparatus, or device.

The hardware adapters 718, 720 in the computing system 712 may enable the processor 714 to interface with various other hardware elements, external and internal to the computing system 712. For example, the peripheral device adapters 718 may provide an interface to input/output devices, such as, for example, the display device 144, a mouse, or a keyboard. The peripheral device adapters 718 may also provide access to other external devices such as an external storage device, a number of network devices such as, for example, servers, switches, and routers, client devices, other types of computing devices, and combinations thereof.

The display device 144 may be provided to allow an operator of the computing system 712 to interact with and implement the functionality of the computing system 712. The peripheral device adapters 718 may also create an interface between the processor 714 and the display device 144, a printer, or other media output devices. The network adapter 720 may provide an interface to other computing devices within, for example, a network, thereby enabling the transmission of data between the computing system 712 and other devices located within the network. The network adapter 720 may provide an interface to an external telecommunications network such as a cellular phone network, the communications link 115, or other external networks, thereby enabling the transmission of data between the computing system 712 and other external devices such as an external storage device, a number of network devices such as, for example, servers, switches, and routers, client servers, radio frequency enabled devices, other client devices, other types of computing devices, and combinations thereof.

The computing system 712 may, when executed by the processor 714, display a number of GUIs 147 on the display device 144 associated with the executable program code representing the number of applications stored on the data storage device 716. The GUIs 147 may display, for example, interactive screenshots that allow an operator to interact with the computing system 712 to input commands in association with the chassis 116, 118 in association with the test and control tool 146 as will be described in more detail below. Examples of display devices 144 may include a computer screen, a laptop screen, a mobile device screen, a personal digital assistant (PDA) screen, and a tablet screen, among other display devices 144.

The computing system 712 may further include the test and control tool 146. As will be described in more detail below, the test and control tool 146 may include the necessary software and hardware, including the tangible, non-transitory computer readable medium, for receiving and processing information from, storing information, commanding, sending information to, sending messages to, and querying the chassis 116, 118 or electronic components therein. The test and control tool 146 may be used in a number of applications. For example, the test and control tool 146 may be used to configure the airflow direction for the physical hardware, simulated hardware, or combinations thereof of chassis, such as the chassis 116, 118. The test and control tool 146 may detect, within the chassis 116, 118, additional power supply units, such as the secondary power supply unit 208.

With reference to FIG. 2 and FIG. 3, the test and control tool 146 may compare the configured airflow direction for the physical hardware, simulated hardware, or combinations thereof in the chassis 116, 118, either front-to-back or back-to-front, to the airflow direction of the power supply units 205, 208, or 305 or to the airflow direction of the corresponding fan trays 215, 216, 218, 315, 316, 318, and 319. The test and control tool 146 may compare the configured airflow direction for the physical hardware, simulated hardware, or combinations thereof, to the airflow direction of the power supply units 205, 208, or 305 or fan trays 215, 216, 218, 315, 316, 318, and 319. The test and control tool 146 may check for and log any airflow direction conflicts. The test and control tool 146 may notify the operator of the conflicts and may disable operation of the power supply units 205, 208, or 305 or fan trays 215, 216, 218, 315, 316, 318, and 319 if there is an airflow direction conflict.

Although the test and control tool 146 is depicted as being internal to the data storage device 716, in another example, the test and control tool 146 may be a peripheral device coupled to the computing system 712 or included within a peripheral device coupled to the computing system 712. Although the test and control tool 146 is depicted as a separate module, it may be integrated with one or many other modules.

The computing system 712 may further include a number of modules used in the implementation of the systems and methods described herein. The various modules within the computing system 712 may include executable program code that may be executed separately. In this example, the various modules may be stored as separate computer program products. In another example, the various modules within the computing system 712 may be combined within a number of computer program products; each computer program product including a number of the modules.

Figure 8:
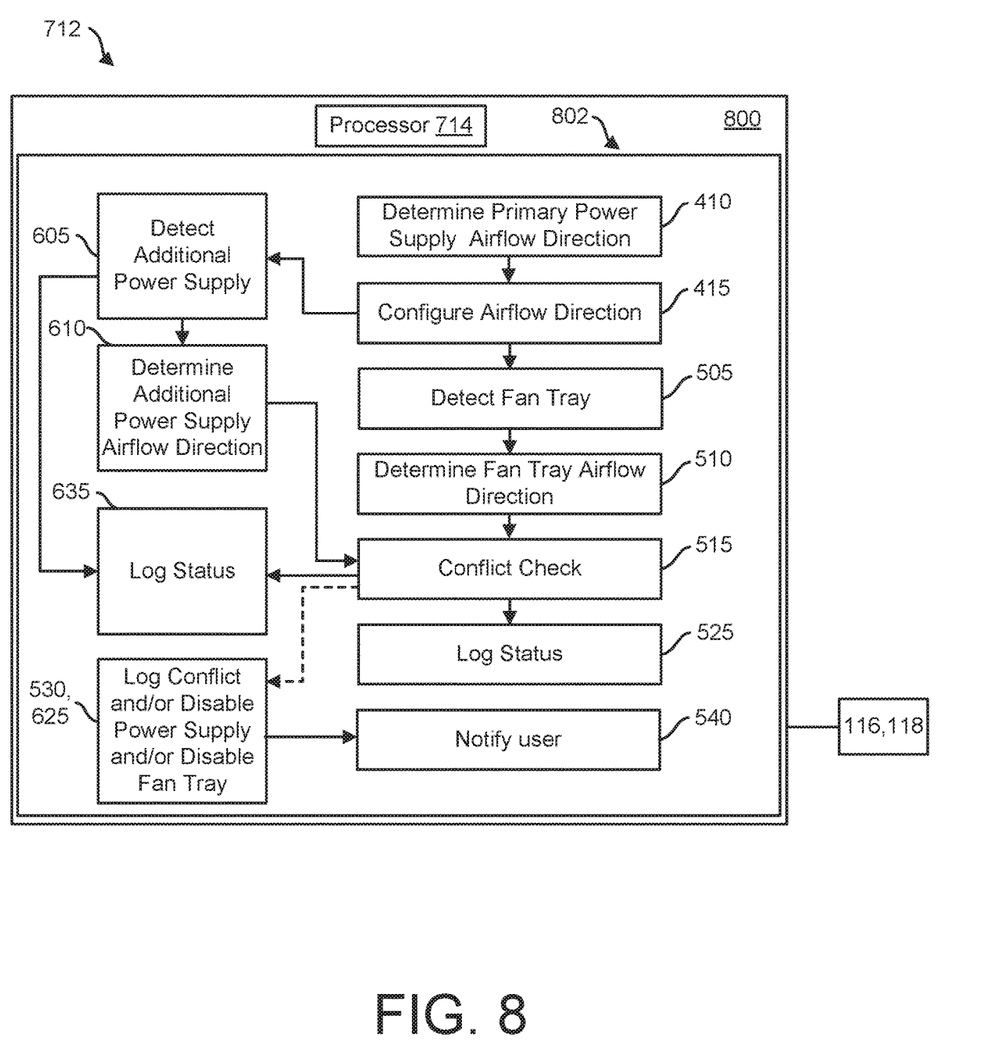
FIG. 8 is the computing system of FIG. 7 including a non-transitory computer-readable medium with computer executable instructions stored thereon, according to one or more examples disclosed.

FIG. 8 is the computing system of FIG. 7 including a non-transitory computer-readable medium 802 with computer executable instructions 800 stored thereon, according to one or more examples disclosed. When the computer executable instructions 800 are executed by the one or more processors 714, the computer executable instructions 800 may cause the one or more processors 714 to determine (block 410) a primary power supply unit airflow direction. The primary power supply airflow direction may be determined (block 410) upon initilization of the primary power supply unit. The computer executable instructions 800 may cause the one or more processors 714 to configure (block 415) the electronic box airflow direction based on the airflow direction of the primary power supply unit to create a configured airflow direction. For example and with reference to FIG. 1, FIG. 2, and FIG. 3; when the computer executable instructions 800 are executed by the one or more processors 714, the computer executable instructions 800 may cause the one or more processors 714 to implement at least the functionality of sending a request to the primary power supply units 205 and 305 to return data about the primary power supply units 205 and 305 or about the flow direction of the unidirectional fan or fans, not shown, installed within the primary power supply units 205 and 305; receiving an identification number stored within an EEPROM or other memory within the primary power supply units 205 and 305, using a look-up-table or other data to determine the flow direction of the unidirectional fan or fans. The computer executable instructions 800 may cause the one or more processors 714 to configure (block 415) the airflow direction of the chassis 116 or 118 based on the airflow direction of the primary power supply units 205 or 305.

When the computer executable instructions 800 are executed by the one or more processors 714, the computer executable instructions 800 may cause the one or more processors 714 to detect (block 605) additional power supply units; determine (block 610) the airflow direction of the additional power supply units; conduct (block 515) conflict checks, and log the status (block 635) of the airflow direction if no conflict is determined (block 515) or disabling and logging (block 625) the detected additional power supply units if a conflict is determined (block 515) and notifying (block 540) the operator or operators. The computer executable instructions 800 may cause the one or more processors 714 to detect (block 505) fan trays; determine (block 510) the airflow direction of the fan trays; conduct (block 515) conflict checks, and log the status (block 525) of the airflow direction if no conflict is determined (block 515) or disable the fan trays with conflicting airflow direction and/or log (block 530) the conflict if a conflict 620 is determined (block 515) and notifying (block 540) the operator or operators.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A method comprising:
powering on at least a first power supply unit installed within the chassis;
in response to powering on the first power supply unit, determining, by a control tool operating in the chassis, an airflow direction of the first power supply unit comprising one or more unidirectional fans,
wherein the control tool sends a request to the first power supply unit to obtain at least one of:
information used by the control tool to determine a flow direction of the one or more unidirectional fans; or
data which indicates whether the one or more unidirectional fans are configured for front-to-back or back-to-front operations;
configuring, by the control tool operating in the chassis, the airflow direction through the chassis to be the airflow direction of the first power supply unit to create a first configured airflow direction;
determining, by the control tool, an airflow direction of a first fan tray installed within the chassis, the first fan tray comprising one or more unidirectional fans; and
conducting a conflict check to determine whether the first configured airflow direction matches the airflow direction of the first fan tray.

2. The method of claim 1, further comprising:
disabling operation of the first fan tray unit and notifying an operator if the airflow directions do not match one another.

3. The method of claim 1, wherein the first power supply unit and the first fan tray are field replaceable units and further comprising:
replacing the first fan tray with a second fan tray if the airflow direction of the first fan tray does not match the first configured airflow direction;
wherein the second fan tray comprises one or more unidirectional fans.

4. The method of claim 3, further comprising:
determining an airflow direction of the second fan tray;
conducting a conflict check to determine whether the first configured airflow direction matches the airflow direction of the second fan tray;
logging the results; and
in response to determining that the first configured airflow direction does not match the airflow direction of the second fan tray, disabling operation of the second fan tray and notifying the operator.

5. The method of claim 1, further comprising:
resetting a runtime event for the chassis; and
replacing the first power supply unit with a second power supply unit;
the second power supply unit comprising one or more unidirectional fans.

6. The method of claim 5, further comprising:
powering on at least the second power supply unit and the first fan tray installed within the chassis;
determining an airflow direction of the second power supply unit;
configuring the airflow direction through the chassis to be the airflow direction of the second power supply unit to create a second configured airflow direction;
determining an airflow direction of the first fan tray;
conducting a conflict check to determine whether the second configured airflow direction matches the airflow direction of the first fan tray;
logging the results; and
in response to determining that the second configured airflow direction does not match the airflow direction of the first fan try, disabling operation of the first fan tray and notifying the operator.

7. The method of claim 2, further comprising:
powering all the electronic components installed within the chassis;
determining if additional power supply units are operating within the chassis;
determining, if operating, an airflow direction of a second power supply unit comprising one or more unidirectional fans;
conducting a conflict check to determine whether the first configured airflow direction matches the airflow direction of the second power supply unit;
logging the results; and
in response to determining that the first configured airflow direction does not match the airflow direction of the second power supply unit, disabling operation of the second power supply unit and notifying the operator.

8. The method of claim 7, wherein the first power supply unit and the second power supply unit are field replaceable units and further comprising:
replacing the second power supply unit with a third power supply unit if the airflow directions between the first configured airflow direction and the second power supply unit do not match one another, the third power supply unit comprising one or more unidirectional fans with an airflow direction that is the same, after installation in the chassis, as the first configured airflow direction.

9. The method of claim 8, further comprising:
powering on the third power supply unit within the chassis;
conducting a conflict check to determine whether the first configured airflow direction matches the airflow direction of the third power supply unit;
logging the results; and
in response to determining that the first configured airflow direction does not match the airflow direction of the third power supply unit, disabling operation of the third power supply unit and notifying the operator.

10. A system comprising:
a processor;
a first chassis having electronic components installed therein comprising a control tool operating in the first chassis, at least a first power supply unit and at least a first fan tray; and
a memory that stores instructions that cause the processor to:
power on the first power supply unit comprising one or more unidirectional fans;
in response to powering on the first power supply unit, determine, by the control tool operating in the first chassis, an airflow direction of the first power supply unit,
wherein the control tool sends a request to the first power supply unit to obtain at least one of:
information used by the control tool to determine a flow direction of the one or more unidirectional fans; or
data which indicates whether the one or more unidirectional fans are configured for front-to-back or back-to-front operations; and
configure, by the control tool operating in the first chassis, the airflow direction through the first chassis to be the airflow direction of the first power supply unit to create a first configured airflow direction.

11. The system of claim 10, wherein the instructions further cause the processor to:
determine, by the control tool operating in the first chassis, an airflow direction of the first fan tray comprising one or more unidirectional fans;

conduct a conflict check to determine whether the first configured airflow direction matches the airflow direction of the first fan tray;

log the results; and in response to determining that the first configured airflow direction does not match the airflow direction of the first fan tray, disable operation of the first fan tray unit and notify an operator.

12. The system of claim 11, wherein the instructions further cause the processor to:

power on at least a second fan tray installed within the first chassis;

determine, by the control tool operating in the first chassis, an airflow direction of the second fan tray comprising one or more unidirectional fans;

conduct a conflict check to determine whether the first configured airflow direction matches the airflow direction of the second fan tray;

log the results; and in response to determining that the first configured airflow direction does not match the airflow direction of the second fan tray, disable operation of the second fan tray and notify the operator.

13. The system of claim 11, wherein the instructions further cause the processor to:

power all the electronic components installed within the first chassis;

determine if additional power supply units are operating within the first chassis;

determine, if operating, an airflow direction of a second power supply unit comprising one or more unidirectional fans;

conduct a conflict check to determine whether the first configured airflow direction matches the airflow direction of the second power supply unit;

log the results; and in response to determining that the first configured airflow direction does not match the airflow direction of the second power supply unit, disable the second power supply unit and notify the operator.

14. The system of claim 11, further comprising a second chassis having at least one power supply unit and at least one fan tray installed within the second chassis; and wherein the instructions further cause the processor to:

determine an airflow direction of a first power supply unit within the second chassis, the first power supply unit within the second chassis comprising one or more unidirectional fans; and configure an airflow direction through the second chassis to be the airflow direction of the first power supply unit within the second chassis to create a second configured airflow direction.

15. The system of claim 14, wherein the instructions further cause the processor to:

determine an airflow direction of a first fan tray within the second chassis, the first fan tray within the second chassis comprising one or more unidirectional fans;

conduct a conflict check to determine whether the second configured airflow direction matches the airflow direction of the first fan tray within the second chassis;

log the results; and in response to determining that the second configured airflow direction does not match the airflow direction of the first fan tray within the second chassis, disable operation of the first fan tray within the second chassis and notify the operator.

16. A non-transitory, computer-readable medium storing computer-executable instructions, which when executed, cause a computer to:

in response to powering on a first power supply unit installed within a first chassis, determine, by a control tool operating in the chassis, an airflow direction of the first power supply unit installed within the first chassis, the first power supply unit comprising one or more unidirectional fans, wherein the control tool sends a request to the first power supply unit to obtain at least one of:

information used by the control tool to determine a flow direction of the one or more unidirectional fans; or data which indicates whether the one or more unidirectional fans are configured for front-to-back or back-to-front operations; and configure, by the control tool operating in the first chassis, an airflow direction through the first chassis to be the airflow direction of the first power supply unit to create a first configured airflow direction.

17. The non-transitory, computer-readable medium of claim 16, wherein the computer-executable instructions further cause the computer to:

determine an airflow direction of a first fan tray installed within the first chassis, the first fan tray comprising one or more unidirectional fans;

conduct a conflict check to determine whether the first configured airflow direction matches the airflow direction of the first fan tray;

log the results; and in response to determining that the first configured airflow direction does not match the airflow direction of the first fan tray, disable operation of the first fan tray within the first chassis and notify an operator.

18. The non-transitory, computer-readable medium of claim 17, wherein the computer-executable instructions further cause the computer to:

power on at least a second fan tray installed within the first chassis;

determine an airflow direction of the second fan tray comprising one or more unidirectional fans;

conduct a conflict check to determine whether the first configured airflow direction matches the airflow direction of the second fan tray;

log the results; and in response to determining that the first configured airflow direction does not match the airflow direction of the second fan tray, disable operation of the second fan tray within the first chassis and notify the operator.

19. The non-transitory, computer-readable medium of claim 17, wherein the computer-executable instructions further cause the computer to:

determine if additional power supply units are operating within the first chassis;

determine, if operating, an airflow direction of a second power supply unit comprising one or more unidirectional fans;

conduct a conflict check to determine whether the first configured airflow direction matches the airflow direction of the second power supply unit;

log the results; and in response to determining that the first configured airflow direction does not match the airflow direction of the second power supply unit, disable operation of the second power supply unit and notify the operator.

20. The non-transitory, computer-readable medium of claim 17, wherein the computer-executable instructions further cause the computer to:
- determine an airflow direction of a first power supply unit within a second chassis, the first power supply unit within the second chassis comprising one or more unidirectional fans; and
- configure an airflow direction through the second chassis to be the airflow direction of the first power supply unit within the second chassis to create a second configured airflow direction.

* * * * *